United States Patent
Luo et al.

(10) Patent No.: US 9,236,384 B2
(45) Date of Patent: Jan. 12, 2016

(54) SEMICONDUCTOR MEMORY DEVICE AND METHOD FOR ACCESSING THE SAME

(75) Inventors: Zhijiong Luo, Poughkeepsie, NY (US); Zhengyong Zhu, Beijing (CN); Haizhou Yin, Poughkeepsie, NY (US); Huilong Zhu, Poughkeepsie, NY (US)

(73) Assignee: Institute of Microelectronics, Chinese Acasemy of Sciences, Beijing (CN)

( * ) Notice: Subject to any disclaimer, the term of this patent is extended or adjusted under 35 U.S.C. 154(b) by 0 days.

(21) Appl. No.: 14/355,120

(22) PCT Filed: Mar. 22, 2012

(86) PCT No.: PCT/CN2012/072808
§ 371 (c)(1),
(2), (4) Date: Apr. 29, 2014

(87) PCT Pub. No.: WO2013/120304
PCT Pub. Date: Aug. 22, 2013

(65) Prior Publication Data
US 2014/0362652 A1    Dec. 11, 2014

(30) Foreign Application Priority Data
Feb. 13, 2012   (CN) .......................... 2012 1 0031880

(51) Int. Cl.
*G11C 11/405*    (2006.01)
*G11C 5/06*    (2006.01)
(Continued)

(52) U.S. Cl.
CPC .............. *H01L 27/1052* (2013.01); *G11C 7/00* (2013.01); *G11C 11/404* (2013.01);
(Continued)

(58) Field of Classification Search
CPC .......... G11C 11/405; G11C 5/06; G11C 7/00; G11C 8/16

USPC .................................... 365/187, 63, 72, 51
See application file for complete search history.

(56) References Cited

U.S. PATENT DOCUMENTS

2005/0185474 A1*  8/2005  Atwood et al. .......... 365/189.01
2006/0028858 A1   2/2006  Atwood et al.
(Continued)

FOREIGN PATENT DOCUMENTS

CN     1842843 A    10/2006
CN   102201442 A     9/2011

OTHER PUBLICATIONS

S. Thiel et al.., "Turnable Quasi-Two-Dimensional Electron Gases in Oxide Heterostructures", Science vol. 313 29, Sep. 2006.
(Continued)

*Primary Examiner* — Ly D Pham
(74) *Attorney, Agent, or Firm* — Kinney & Lange, P.A.

(57) ABSTRACT

A semiconductor memory device and a method for accessing the same are disclosed. The semiconductor memory device comprises a memory transistor, a first control transistor and a second control transistor, wherein a source electrode and a gate electrode of the first control transistor are coupled to a first bit line and a first word line respectively, a drain electrode and a gate electrode of the second control transistor are coupled to a second word line and a second bit line respectively, a gate electrode of the memory transistor is coupled to a drain electrode of the first control transistor, a drain electrode of the memory transistor is coupled to a source electrode of the second control transistor, and a source electrode of the memory transistor is coupled to ground, and wherein the memory transistor exhibits a gate electrode-controlled memory characteristic. The semiconductor memory device increases integration level and decreases refresh frequency.

19 Claims, 2 Drawing Sheets

(51) Int. Cl.
*G11C 5/02* (2006.01)
*G11C 7/00* (2006.01)
*H01L 27/105* (2006.01)
*G11C 11/404* (2006.01)
*H01L 29/267* (2006.01)
*H01L 29/786* (2006.01)
*G11C 8/16* (2006.01)
*H01L 27/108* (2006.01)

(52) U.S. Cl.
CPC ......... *H01L 29/267* (2013.01); *H01L 29/7869* (2013.01); *G11C 5/06* (2013.01); *G11C 8/16* (2013.01); *G11C 11/405* (2013.01); *H01L 27/108* (2013.01)

(56) References Cited

U.S. PATENT DOCUMENTS

| | | | |
|---|---|---|---|
| 2006/0164876 A1* | 7/2006 | Barth et al. | 365/46 |
| 2007/0241367 A1* | 10/2007 | Ouyang et al. | 257/190 |
| 2007/0249115 A1* | 10/2007 | Luk et al. | 438/238 |
| 2008/0025113 A1* | 1/2008 | Kitagawa | 365/189.09 |
| 2008/0087929 A1* | 4/2008 | Ostermayr et al. | 257/296 |
| 2008/0205182 A1* | 8/2008 | Huber et al. | 365/222 |
| 2009/0042333 A1 | 2/2009 | Van de Walle et al. | |
| 2009/0103390 A1* | 4/2009 | Kim et al. | 365/230.05 |
| 2010/0054057 A1* | 3/2010 | Meterelliyoz et al. | 365/194 |
| 2010/0172195 A1* | 7/2010 | Moore et al. | 365/189.16 |
| 2011/0065237 A1 | 3/2011 | Bennahmias et al. | |
| 2012/0063202 A1* | 3/2012 | Houston et al. | 365/149 |
| 2013/0208551 A1* | 8/2013 | Zhu et al. | 365/189.011 |
| 2014/0206138 A1* | 7/2014 | Desu et al. | 438/104 |

OTHER PUBLICATIONS

Cheng Cen et al., "Oxide Nanoelectronics on Demand", Science, vol. 323, Feb. 20, 2009.
International Search Report dated Nov. 9, 2012, for PCT/CN2012/072808.
First Office Action for corresponding CN Application No. 201210031880.X, dated Jul. 3, 2015, 8 pages.
Response filed Nov. 8, 2014, to first Chinese Office Action and its English translation for corresponding Chinese Application No. 201210031880.X.
Claim Amendments filed on Nov. 18, 2015, in response to first Chinese Office Action and its English translation for corresponding Chinese Application No. 201210031880.X.

* cited by examiner

SEMICONDUCTOR MEMORY DEVICE AND METHOD FOR ACCESSING THE SAME

CROSS-REFERENCE TO RELATED APPLICATIONS

This application is a National Phase application of, and claims priority to, PCT Application No. PCT/CN2012/072808, filed on Mar. 22, 2012, entitled "Semiconductor Memory Device and Method for Accessing the Same", which claims priority to the Chinese Patent Application No. 201210031880.X, filed on Feb. 13, 2012. Both the PCT Application and Chinese Application are incorporated herein by reference in their entireties.

TECHNICAL FIELD

The present invention relates to a semiconductor memory device and a method for accessing the same, and in particular, to a semiconductor memory device using a memory transistor and a method for accessing the same.

BACKGROUND

In a memory cell having a two-transistors/one-capacitor (2T/1C) configuration, the capacitor C stores charges representative of logic "1" or logic "0", and the first control transistor Q1 and the second control transistor Q2 perform reading operation and writing operation, respectively.

Because 2T/1C memory device stores data in the capacitor, it should be refreshed at a time interval and can only be used as a dynamic random access memory (DRAM). A refresh period of the 2T/1C memory cell should be smaller than a retention time of the capacitor. Due to the periodical refresh of the 2T/1C memory cell, the memory has a complex controller circuit and has a large power dissipation.

In the 2T/1C memory cell, it is necessary for the capacitor to have large capacitance so as to provide a retention time as long as possible, which, however, increases occupied area of the memory cell and decreases integration level of the memory.

Thus, it is still desirable to develop a memory cell without a capacitor.

SUMMARY OF THE INVENTION

The object of the present disclosure is to provide a semiconductor memory having a high integration level and reduced refresh operations.

According to one aspect of the present invention, there is provided a semiconductor memory device comprising a memory transistor, a first control transistor and a second control transistor, wherein a source electrode and a gate electrode of the first control transistor are coupled to a first bit line and a first word line respectively, a drain electrode and a gate electrode of the second control transistor are coupled to a second word line and a second bit line respectively, a gate electrode of the memory transistor is coupled to a drain electrode of the first control transistor, a drain electrode of the memory transistor is coupled to a source electrode of the second control transistor, and a source electrode of the memory transistor is coupled to ground, and wherein the memory transistor exhibits a gate electrode-controlled memory characteristic.

According to another aspect of the present invention, there is provided a method for accessing the above semiconductor memory device, comprising: in reading operation, a read control voltage is applied to the gate electrode of the second control transistor via the second bit line to switch on the second control transistor, an on/off state of the memory transistor is detected via the second word line to read a data signal; and in writing operation, a write control voltage is applied to the gate electrode of the first control transistor via the first word line to switch on the first control transistor, and a data signal is applied to the gate electrode of the memory transistor via the first bit line to write the data signal by changing an on/off state of the memory transistor with different levels of the data signal.

The present semiconductor memory device has a 3T configuration, in which the memory transistor exhibits a gate-controlled memory characteristic. For example, the memory transistor is an oxide heterojunction field effect transistor. The memory transistor stores data utilizing the gate-controlled memory characteristic and does not need an additional capacitor.

Compared with a semiconductor memory device having a capacitor, the inventive semiconductor memory device with the memory transistor has a substantially reduced occupied area. Integration level of memory cells is increased accordingly. Moreover, the memory effect of the oxide heterojunction field effect transistor is utilized to store data in a long period, which decreases refresh frequency. In a case that a retention period of the oxide heterojunction field effect transistor is larger than its work time, no refresh operation is performed. Thus, the inventive semiconductor memory device having the 3T configuration can decrease power dissipation remarkably, and simplifies a controller circuit of the semiconductor memory device.

Furthermore, the inventive semiconductor memory device can be manufactured with a process completely compatible with current semiconductor processes. For example, the manufacturing process includes epitaxially growing thin films (for example, by PLD, MBE, ALD, CVD, sputtering, and the like), patterning (for example, by lithography, electron beam exposure, and the like), etching (for example, by dry etching using plasma, wet etching using etchant solution, and the like), depositing and peeling off metal layers, planarization (for example, by SOG, CMP, and the like), ion implantation, thermal anneal, and the like. Thus, the semiconductor memory device according to the present disclosure can be manufactured with low cost.

DETAILED DESCRIPTION

The present disclosure will be described below with those preferred embodiments in connection with attached drawings. However, it should be understood that the descriptions here are only illustrative, without intention of limiting a protection scope. Also, the following description omits details of those known structure and techniques so that concepts of the disclosure are not obscured unnecessarily.

Cheng Cen et al. disclose in "Oxide Nanoelectronics on Demand", Science, Vol. 323, p 1026-1029 that conductivity of a heterojunction of a lanthanum aluminate film and a strontium titanate substrate can be controlled by a voltage at a probe tip of an AFM. Consequently, 2-dimensional electron gas is created at an interface between the lanthanum aluminate film and the strontium titanate substrate when the voltage at the probe tip is positive and has a relatively high value, and the 2-dimensional electron gas disappears at the interface between the lanthanum aluminate film and the strontium titanate substrate when the voltage at the probe tip is negative and has a relatively high value. The conductivity of the heterojunction interface may be tuned by the applied voltage repeatedly and varies little in 9 days. In other words, the conductivity of the heterojunction interface is memorized.

Figure 1:
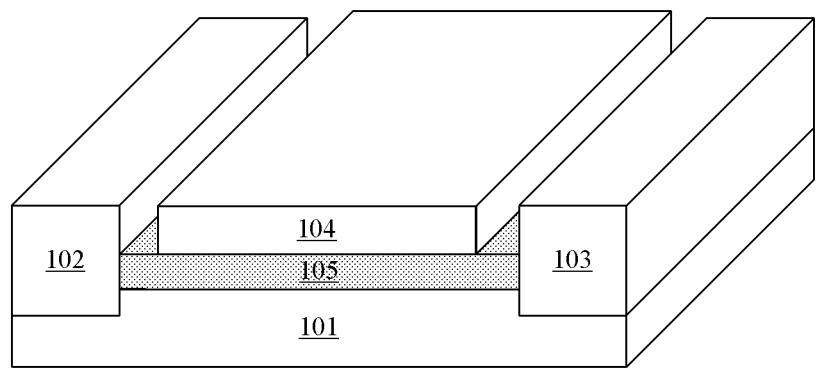
FIG. 1 is a schematic diagram illustrating a structure of an oxide heterojunction transistor according to an embodiment of the present disclosure.

On the basis of the above effect, the inventor proposes an oxide heterojunction field effect transistor Q100 as shown in FIG. 1. Similar to a conventional metal-oxide-semiconductor field effect transistor (MOSFET), the oxide heterojunction field effect transistor comprises a source electrode 102, a drain electrode 103 and a gate electrode 104. Different from the conventional MOSFET, the oxide heterojunction field effect transistor is formed on an oxide substrate 101. An oxide film 105 is formed on the oxide substrate 101. The oxide film 105 forms a heterojunction with the oxide substrate 101. 2-dimensional electron gas (not shown) can be created at an interface between the oxide substrate 101 and the oxide film 105, which is also a heterojunction interface, to provide a channel region for the device. The source electrode 102 and the drain electrode 103 are formed in the oxide substrate 101 on both sides of the gate electrode 104, and contact the heterojunction interface.

The gate electrode 104 of the oxide heterojunction field effect transistor Q100 controls the channel with a memory effect.

Although the oxide heterojunction field effect transistor and MOSFETs will be described in this embodiment, the memory transistor Q100 may be other types of transistor exhibiting a gate-control memory effect, and the first control transistor Q101 and the second control transistor Q102 may be other types of transistors which have switch characteristic.

The first control transistor Q101 and/or the second control transistor Q102 may be ones selected from a group IV (such as Si, Ge) semiconductor device, a group III-V (such as gallium arsenide, gallium nitride) semiconductor device, a group II-VI semiconductor device, a graphene semiconductor device, an oxide semiconductor device, an oxide heterojunction semiconductor device.

The memory transistor Q100, the first control transistor Q101 and the second control transistor Q102 may be formed on the same semiconductor substrate or different semiconductor substrates.

In an example that the memory transistor Q100 is an oxide heterojunction field effect transistor, the oxide heterojunction field effect transistor comprises an oxide base layer (such as strontium titanate) on a semiconductor substrate (such as Si) and an oxide film on the oxide base layer. Alternatively, the oxide heterojunction field effect transistor comprises an oxide film directly on an oxide substrate.

Preferably, the oxide heterojunction field effect transistor and the MOSFETs are integrated in the same substrate. The substrate may be a semiconductor substrate. In an active region of the semiconductor substrate for the oxide heterojunction field effect transistor, the oxide base layer is firstly formed on the semiconductor substrate, the oxide film is then formed on the oxide base layer, followed by other steps for finishing the oxide heterojunction field effect transistor. In an active region of the semiconductor substrate for the MOSFETs, various parts of the MOSFETs are formed directly on the semiconductor substrate.

In an example that the memory transistor Q100 is an oxide heterojunction field effect transistor, the oxide substrate, the oxide base layer and/or the oxide film may be made of at least one selected from a group consisting of lanthanum aluminate, strontium titanate, potassium tantalate, lithium tantalate, lithium niobate, lead titanate, lead zirconate, barium tatanate, lanthanum vanadate, calcium hafnate, gadolinium scandate, dysprosium scandate, strontium zirconate, magnesium oxide, aluminium oxide, silicon dioxide, zinc oxide, tantalum oxide, hafnium oxide, lanthanum oxide, nickel oxide, niobium oxide, tungsten oxide, copper oxide, titanium oxide, zirconium oxide. For example, the oxide substrate, the oxide base layer and/or the oxide film each may be any combinations of the above materials, such as a stack of the above materials.

In an example that the memory transistor Q100 is an oxide heterojunction field effect transistor, the oxide substrate, the oxide base layer and/or the oxide film may be doped or undoped. The oxide substrate may be a single-crystal substrate. The oxide base layer and/or the oxide film may be grown epitaxially.

Figure 2:
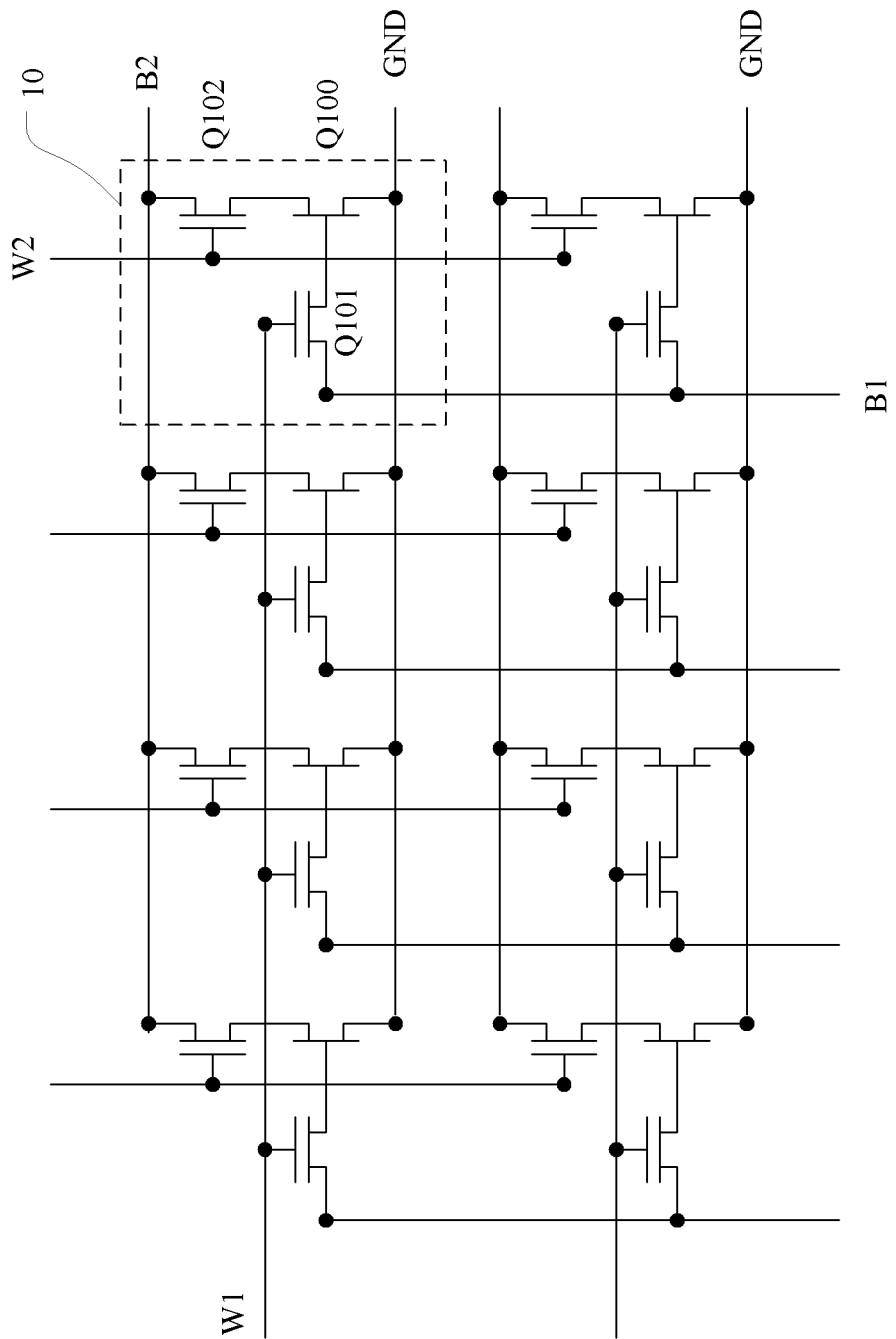
FIG. 2 shows a memory array having a 3T configuration according to an embodiment of the present invention.

FIG. 2 shows a memory array having a 3T configuration according to an embodiment of the present invention, wherein the memory transistor Q100 as shown in FIG. 1 is used to replace a capacitor for storing data. The memory array in FIG. 2 includes 8 memory cells arranged in 2 rows×4 columns. The top right one memory cell 10 is indicated by a block with broken line.

The memory cell 10 comprises three field effect transistors. The memory transistor Q100 is used for storing data with an amount of charges representative of logic "1" or logic "0". For example, the first control transistor Q101 and the second control transistor Q102 are conventional MOSFETs for performing a writing operation and a reading operation, respectively. A source electrode and a gate electrode of the first control transistor Q101 are coupled to a bit line B1 and a word line W1 which is used for applying a write control voltage, respectively. A drain electrode and a gate electrode of the second control transistor Q102 are coupled to a bit line B2 and a word line W2 which is used for applying a read control voltage, respectively. A gate electrode, a drain electrode and a source electrode of the memory transistor Q100 are coupled to a drain electrode of the first control transistor Q101, a source electrode of the second control transistor Q102, and ground, respectively.

In writing operation, a write control voltage $V_{write}$ is applied to the gate electrode of the first control transistor Q101 of the memory cell 10 via the word line W1 to switch on the first control transistor Q101. A data signal representative of logic "1" or logic "0" is applied to the gate electrode of the memory transistor Q100 via the bit line B1 to write the data signal by changing an on/off state of the memory transistor Q100 with different levels of the data signal. Even after the writing operation, the memory transistor Q100 maintains the on/off state for a period (in a retention time) and stores the date signal therein.

In reading operation, a read control voltage $V_{read}$ is applied to the gate electrode of the second control transistor Q102 of the memory cell 10 via the word line W2 to switch on the second control transistor Q102. The bit line B2 is coupled to the drain electrode of the memory transistor Q100 via the second control transistor Q102 to detect an on/off state of the memory transistor Q100 to read a data signal.

In the above embodiment, the first control transistor Q101 and the second control transistor Q102 are used for performing writing operation and reading operation on one memory cell 10, respectively. Thus, a plurality of memory cells can be read and written in parallel so that the reading/writing speed of the semiconductor memory may be increased.

Various embodiments of the present disclosure have been described above. It should be understood that they have been presented by way of example, and not limitation on the protection scope of the present disclosure. The protection scope is defined by the attached claims and their equivalences. One skilled person will readily recognize that various modifications and changes may be made to the present disclosure, without departing from the true scope of the present disclosure.

We claim:

1. A semiconductor memory device, comprising a memory transistor, a first control transistor and a second control transistor,
wherein the first control transistor comprises a source electrode and a gate electrode coupled to a first bit line and a first word line, respectively, and a drain electrode,
wherein the second control transistor comprises a drain electrode and a gate coupled to a second bit line and a second word line, respectively, and a source drain electrode,
wherein the memory transistor comprises a gate electrode coupled to the drain electrode of the first control transistor, a drain electrode coupled to the source electrode of the second control transistor, and a source electrode coupled to ground, and
wherein the memory transistor comprises an oxide heterojunction filed effect transistor and thus exhibits a gate electrode-controlled memory characteristic, wherein the oxide heterojunction field effect transistor comprises an oxide base layer on a semiconductor substrate, an oxide film being located on the oxide base layer and forming a heterojunction with the oxide base layer, and the oxide heterojunction filed effect transistor further comprises a gate electrode on the oxide film, and a source electrode and a drain electrode on opposite sides of the gate electrode and contacting a heterojunction interface.

2. The semiconductor memory device according to claim 1, wherein the first control transistor and/or the second control transistor comprise metal-oxide-semiconductor field effect transistors.

3. The semiconductor memory device according to claim 1, wherein the first control transistor and/or the second control transistor are selected from a group consisting of a group IV semiconductor device, a group III-V semiconductor device, a group II-VI semiconductor device, a graphene semiconductor device, an oxide semiconductor device, and an oxide heterojunction semiconductor device.

4. The semiconductor memory device according to claim 1, wherein the memory transistor, the first control transistor and the second control transistor are formed on one semiconductor substrate.

5. The semiconductor memory device according to claim 1, wherein the memory transistor is formed on a semiconductor substrate which is different from a semiconductor substrate where the first control transistor and the second control transistor are formed.

6. The semiconductor memory device according to claim 1, wherein the oxide base layer is made of at least one selected from a group consisting of lanthanum aluminate, strontium titanate, potassium tantalate, lithium tantalate, lithium niobate, lead titanate, lead zirconate, barium tatanate, lanthanum vanadate, calcium hafnate, gadolinium scandate, dysprosium scandate, strontium zirconate, magnesium oxide, aluminium oxide, silicon dioxide, zinc oxide, tantalum oxide, hafnium oxide, lanthanum oxide, nickel oxide, niobium oxide, tungsten oxide, copper oxide, titanium oxide, and zirconium oxide.

7. The semiconductor memory device according to claim 1, wherein the oxide film is made of at least one selected from a group consisting of lanthanum aluminate, strontium titanate, potassium tantalate, lithium tantalate, lithium niobate, lead titanate, lead zirconate, barium tatanate, lanthanum vanadate, calcium hafnate, gadolinium scandate, dysprosium scandate, strontium zirconate, magnesium oxide, aluminium oxide, silicon dioxide, zinc oxide, tantalum oxide, hafnium oxide, lanthanum oxide, nickel oxide, niobium oxide, tungsten oxide, copper oxide, titanium oxide, and zirconium oxide.

8. The semiconductor memory device according to claim 1, wherein the oxide base layer is doped or undoped.

9. The semiconductor memory device according to claim 1, wherein the oxide film is doped or undoped.

10. The semiconductor memory device according to claim 1, wherein the oxide base layer is an epitaxially layer.

11. The semiconductor memory device according to claim 1, wherein the oxide film is epitaxially grown.

12. A method for accessing the semiconductor memory device according to claim 1, comprising:
in reading operation, applying a read control voltage to the gate electrode of the second control transistor via the second bit word line to switch on the second control transistor, and detecting an on/off state of the memory transistor via the second bit line to read a data signal; and
in writing operation, applying a write control voltage to the gate electrode of the first control transistor via the first word line to switch on the first control transistor, and applying a data signal to the gate electrode of the memory transistor via the first bit line to write the data signal by changing an on/off state of the memory transistor with different levels of the data signal.

13. A semiconductor memory device, comprising a memory transistor, a first control transistor and a second control transistor,
wherein the first control transistor comprises a source electrode and a gate electrode coupled to a first bit line and a first word line, respectively, and a drain electrode,
wherein the second control transistor comprises a drain electrode and a gate electrode coupled to a second bit line and a second word line, respectively, and a source drain electrode,
wherein the memory transistor comprises a gate electrode coupled to the drain electrode of the first control transistor, a drain electrode coupled to the source electrode of the second control transistor, and a source electrode coupled to ground, and
wherein the memory transistor comprises an oxide heterojunction field effect transistor and thus exhibits a gate electrode-controlled memory characteristic, wherein the oxide heterojunction field effect transistor comprises an oxide film being located on an oxide substrate and forming a heterojunction with the oxide substrate, and the oxide heterojunction field effect transistor further comprises a gate electrode on the oxide layer, and a source electrode and a drain electrode on opposite sides of the gate electrode and contacting a heterojunction interface.

14. The semiconductor memory device according to claim 13, wherein the oxide substrate is made of at least one selected from a group consisting of lanthanum aluminate, strontium titanate, potassium tantalate, lithium tantalate, lithium niobate, lead titanate, lead zirconate, barium tatanate, lanthanum vanadate, calcium hafnate, gadolinium scandate, dysprosium scandate, strontium zirconate, magnesium oxide, aluminium oxide, silicon dioxide, zinc oxide, tantalum oxide, hafnium oxide, lanthanum oxide, nickel oxide, niobium oxide, tungsten oxide, copper oxide, titanium oxide, and zirconium oxide.

15. The semiconductor memory device according to claim 13, wherein the oxide substrate is doped or undoped.

16. The semiconductor memory device according to claim 13, wherein the oxide film is made of at least one selected from a group consisting of lanthanum aluminate, strontium titanate, potassium tantalite, lithium tantalite, lithium niobate, lead titanate, lead zirconate, barium tatanate, lanthanum vanadate, calcium hafnate, gadolinium scandate, dysprosium scandate, strontium zirconate, magnesium oxide, aluminum oxide, silicon dioxide, zinc oxide, tantalum oxide, hafnium oxide, lanthanum oxide, nickel oxide, niobium oxide, tungsten oxide, copper oxide, titanium oxide, and zirconium oxide.

17. The semiconductor memory device according to claim 13, wherein the oxide film is doped or undoped.

18. The semiconductor memory device according to claim 13, wherein the oxide film is epitaxially grown.

19. A method for accessing the semiconductor memory device according to claim 13, comprising:
- in reading operation, applying a read control voltage to the gate electrode of the second control transistor via the second word line to switch on the second control transistor, and detecting an on/off state of the memory transistor via the second bit line to read a data signal; and
- in writing operation, applying a write control voltage to the gate electrode of the first control transistor via the first word line to switch on the first control transistor, and applying a data signal to the gate electrode of the memory transistor via the first bit line to write the data signal by changing an on/off state of the memory transistor with different levels of the data signal.

* * * * *